(12) United States Patent
Cheng et al.

(10) Patent No.: US 9,090,452 B2
(45) Date of Patent: Jul. 28, 2015

(54) MECHANISM FOR FORMING MEMS DEVICE

(71) Applicant: Taiwan Semiconductor Manufacturing Co., Ltd, Hsin-Chu (TW)

(72) Inventors: Shyh-Wei Cheng, Zhudong Township (TW); Jui-Chun Weng, Taipei (TW); Hsi-Cheng Hsu, Taichung (TW); Chih-Yu Wang, Taichung (TW); Chuan-Yi Ko, Hsinchu (TW); Ji-Hong Chiang, Changhua (TW); Chung-Hsien Hung, Zhubei (TW); Hsin-Yu Chen, Hsinchu (TW); Chih-Hsien Chen, Hsinchu (TW); Yu-Mei Wu, Keelung (TW); Jong Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/098,974

(22) Filed: Dec. 6, 2013

(65) Prior Publication Data
US 2015/0158716 A1    Jun. 11, 2015

(51) Int. Cl.
*H01L 29/84*    (2006.01)
*B81B 3/00*    (2006.01)
*B81C 1/00*    (2006.01)

(52) U.S. Cl.
CPC ............. *B81B 3/0021* (2013.01); *B81C 1/0019* (2013.01); *B81C 1/00182* (2013.01); *B81C 1/00246* (2013.01)

(58) Field of Classification Search
CPC ............ B81C 1/00158; B81C 1/00404; B81C 1/00134; B81C 1/00912; B81B 7/007
USPC ..................................... 257/254, 418; 438/50
See application file for complete search history.

(56) References Cited

U.S. PATENT DOCUMENTS

| | | | |
|---|---|---|---|
| 2002/0197002 A1* | 12/2002 | Lin ................................. | 385/18 |
| 2004/0121564 A1* | 6/2004 | Gogoi ........................... | 438/479 |
| 2011/0073859 A1* | 3/2011 | Chen et al. ..................... | 257/53 |
| 2012/0107992 A1* | 5/2012 | Karlin et al. .................... | 438/50 |
| 2013/0099355 A1* | 4/2013 | Liu et al. ....................... | 257/532 |

\* cited by examiner

*Primary Examiner* — Trung Q Dang
(74) *Attorney, Agent, or Firm* — Birch, Stewart, Kolasch & Birch, LLP

(57) ABSTRACT

Embodiments of mechanisms for forming a micro-electro mechanical system (MEMS) device are provided. The MEMS device includes a substrate and a MEMS substrate disposed on the substrate. The MEMS substrate includes a movable element, a fixed element and at least a spring connected to the movable element and the fixed element. The MEMS device also includes a polysilicon layer on the movable element.

20 Claims, 14 Drawing Sheets

MECHANISM FOR FORMING MEMS DEVICE

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased.

Micro-electro mechanical system (MEMS) devices have recently been developed. MEMS devices include devices fabricated using semiconductor technology to form mechanical and electrical features. The MEMS devices are implemented in accelerometers, pressure sensors, microphones, actuators, mirrors, heaters, and/or printer nozzles.

BRIEF DESCRIPTION OF THE DRAWINGS

For a more complete understanding of the embodiments, and the advantages thereof, reference is now made to the following descriptions taken in conjunction with the accompanying drawings.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact. Some variations of the embodiments are described. Throughout the various views and illustrative embodiments, like reference numbers are used to designate like elements.

Figure 1A:
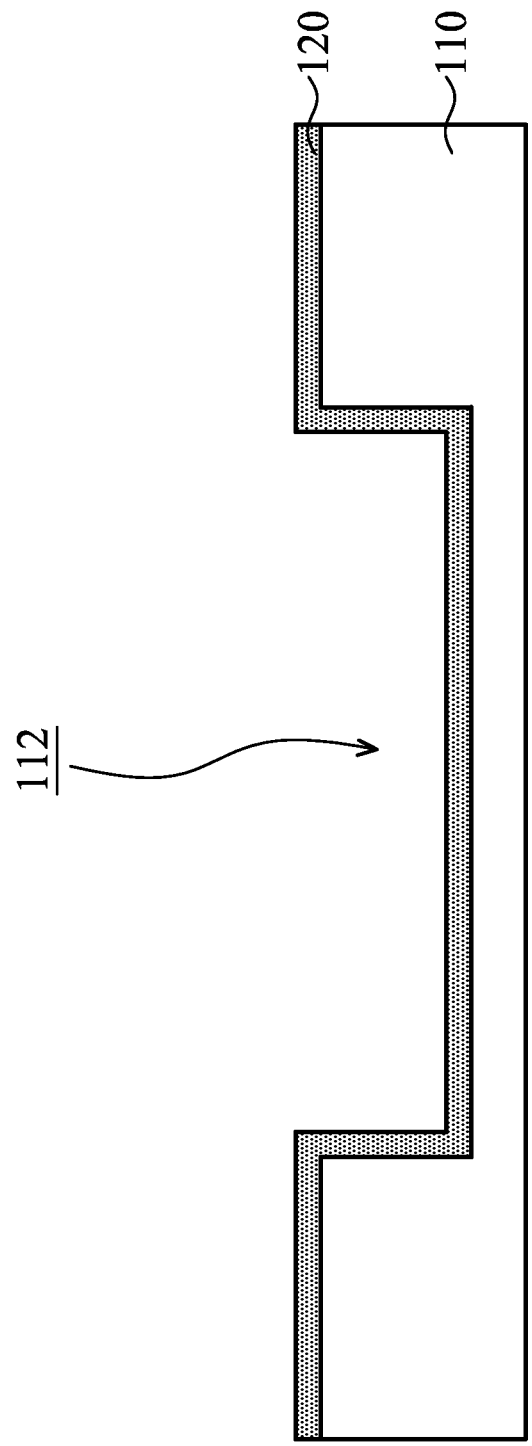
FIGS. 1A-1F are cross-sectional views of various stages of a process for forming a MEMS device, in accordance with some embodiments.

FIGS. 1A-1F are cross-sectional views of various stages of a process for forming a MEMS device, in accordance with some embodiments. As shown in FIG. 1A, a cap substrate 110 may be provided. The cap substrate 110 may be a semiconductor wafer (such as a silicon wafer) or a portion of a semiconductor wafer. In some embodiments, the cap substrate 110 is made of an elementary semiconductor material including silicon or germanium in a single crystal, polycrystal, or amorphous structure.

In some other embodiments, the cap substrate 110 is made of a compound semiconductor, such as silicon carbide, gallium arsenide, gallium phosphide, indium phosphide, indium arsenide, an alloy semiconductor, such as SiGe, or GaAsP, or combinations thereof. The cap substrate 110 has a cavity 112, in accordance with some embodiments.

The cap substrate 110 may be configured to protect a MEMS structure (subsequently formed on the cap structure 110) from environmental contamination. An oxide layer 120 is then formed on the cap substrate 110 by a chemical vapor deposition (CVD) process or a thermal oxidation process, in accordance with some embodiments.

Figure 1B:
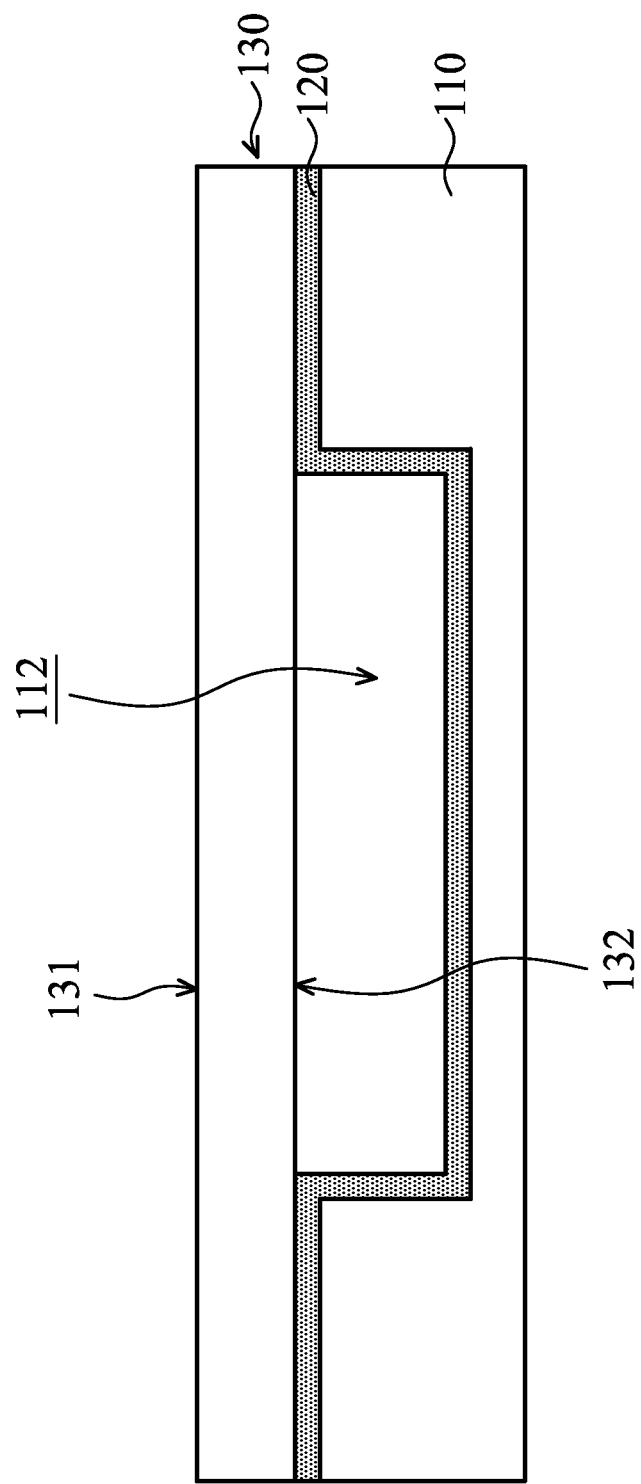

Thereafter, as shown in FIG. 1B, a semiconductor substrate 130 is provided on the cap substrate 110. The semiconductor substrate 130 has two opposite surfaces 131 and 132, and the surface 132 faces the cap substrate 110. The semiconductor substrate 130 may be a semiconductor wafer (such as a silicon wafer) or a portion of a semiconductor wafer. In some embodiments, the semiconductor substrate 130 is made of an elementary semiconductor material including silicon or germanium in a single crystal, polycrystal, or amorphous structure.

In some other embodiments, the semiconductor substrate 130 is made of a compound semiconductor, such as silicon carbide, gallium arsenide, gallium phosphide, indium phosphide, indium arsenide, an alloy semiconductor, such as SiGe, or GaAsP, or combinations thereof. Afterwards, a fusion bonding process may be performed to bond the semiconductor substrate 130 to the cap substrate 110 via the oxide layer 120.

Figure 1C:
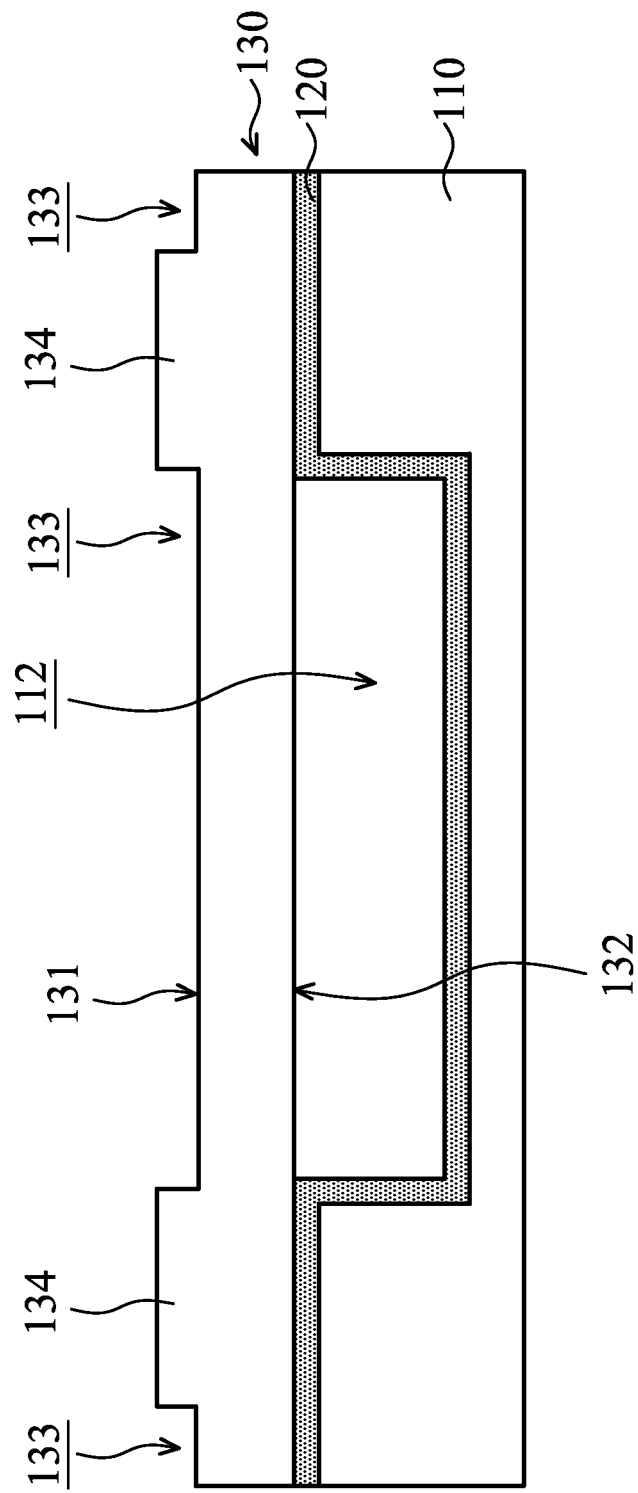

Thereafter, as shown in FIG. 1C, a portion of the semiconductor substrate 130 may be removed to form recesses 133 in the semiconductor substrate 130 and stand-off features 134 defining the recesses 133. The stand-off features 134 may be configured to provide the appropriate separation between the semiconductor substrate 130 and another device connected to the semiconductor substrate 130 in the subsequent process. The removal process includes, for example, a photolithography process and an etching process.

Figure 1D:
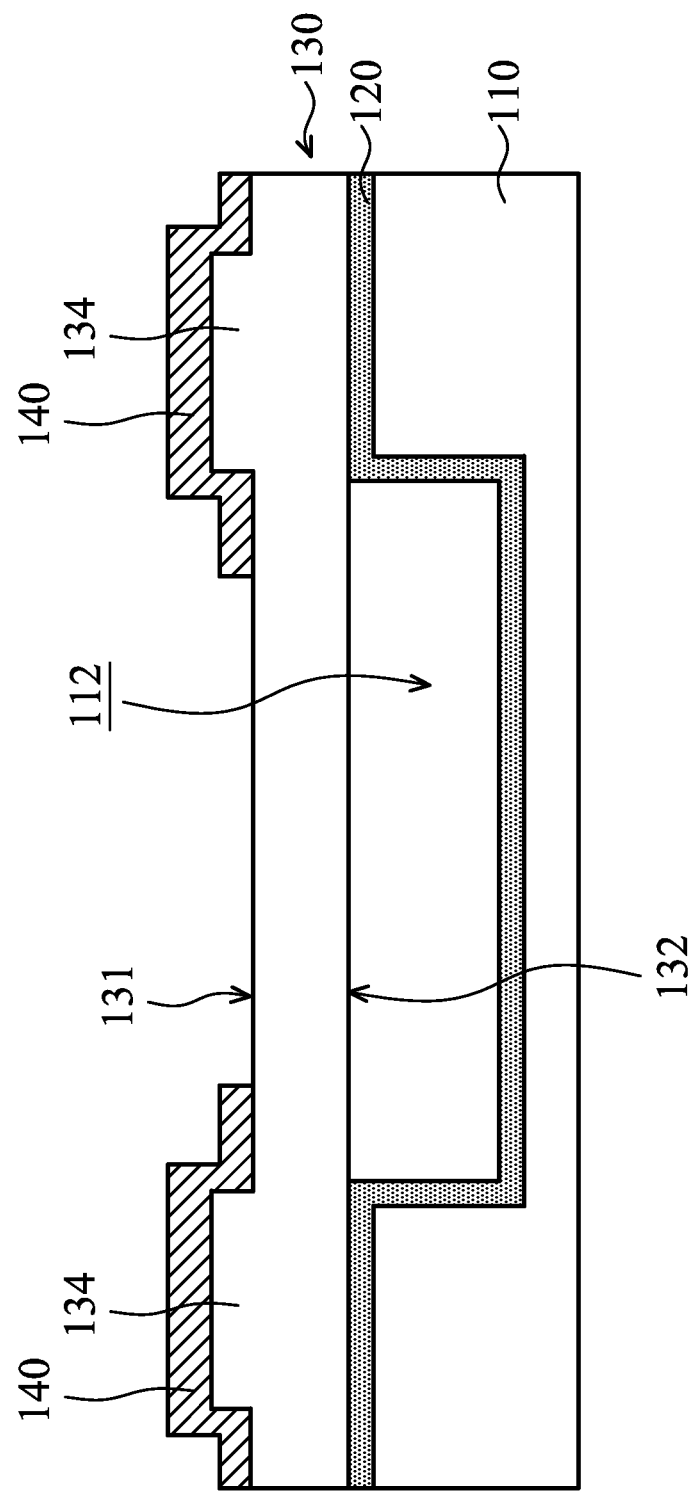

As shown in FIG. 1D, a conductive layer 140 may be formed on the surface 131 of the semiconductor substrate 130. The conductive layer 140 covers the stand-off features 134 and exposes a portion of the semiconductor substrate 130. The conductive layer 140 may act as a pad layer for electrically connecting the semiconductor substrate 130 with another device in the subsequent process. The conductive layer 140 includes germanium (Ge) or other suitable conductive materials.

The forming method of the conductive layer 140 includes, for example, depositing a conductive material layer (not shown) on the surface 131 and patterning the conductive material layer. The deposition of the conductive material layer includes a physical vapor deposition (PVD) process, a sputtering process or other suitable deposition processes.

Thereafter, the patterning of the conductive material layer includes, for example, a photolithography process and an etching process.

Figure 1E:
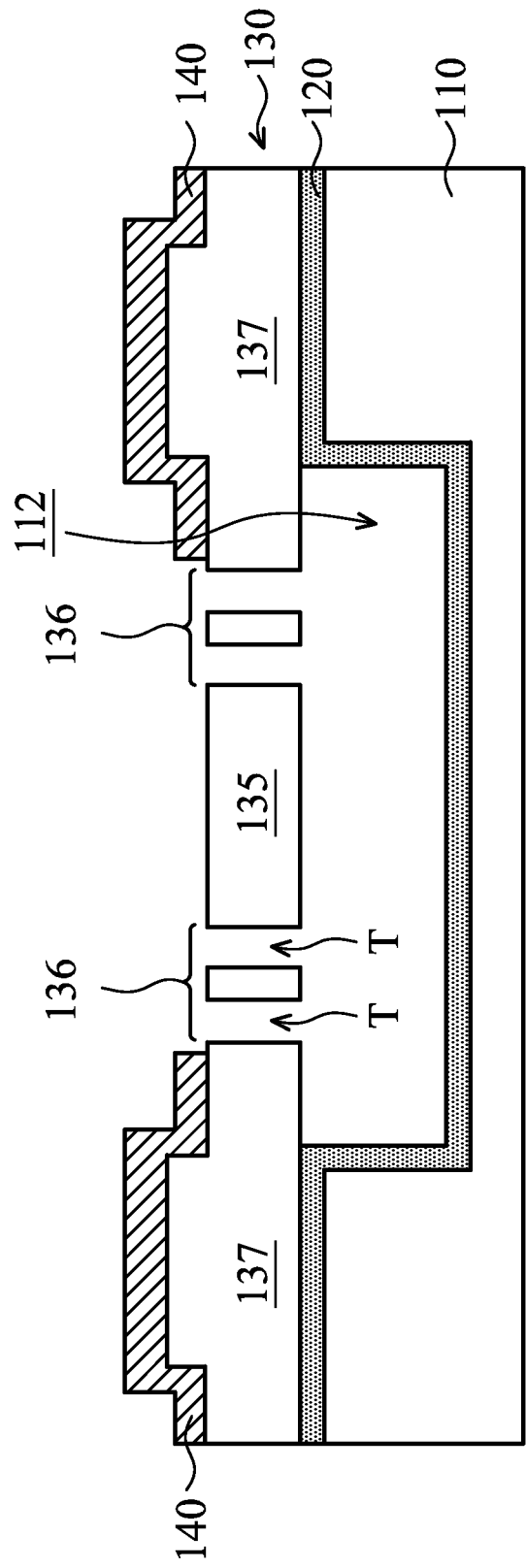

As shown in FIG. 1E, a patterning process is performed to the portion of the semiconductor substrate 130 exposed by the conductive layer 140 to form trenches T passing through the semiconductor substrate 130. The patterning process includes, for example, a photolithography process and an etching process. A movable element (also referred as a proof-mass) 135, springs 136 and a fixed element 137 of the semiconductor substrate 130 are defined by the trenches T.

Each of the springs 136 is connected to the movable element 135 and the fixed element 137. The fixed element 137 supports the springs 136 and the movable element 135. The movable element 135 and the springs 136 are right above the cavity 112 of the cap substrate 110. The movable element 135 is capable of vibrating, bending, deforming, or the like. In some embodiments, the movable element 135 serves as a sensing element. The semiconductor substrate 130 with the movable element 135, the springs 136 and the fixed element 137 may be referred to as a MEMS substrate or a MEMS structure.

Figure 1F:
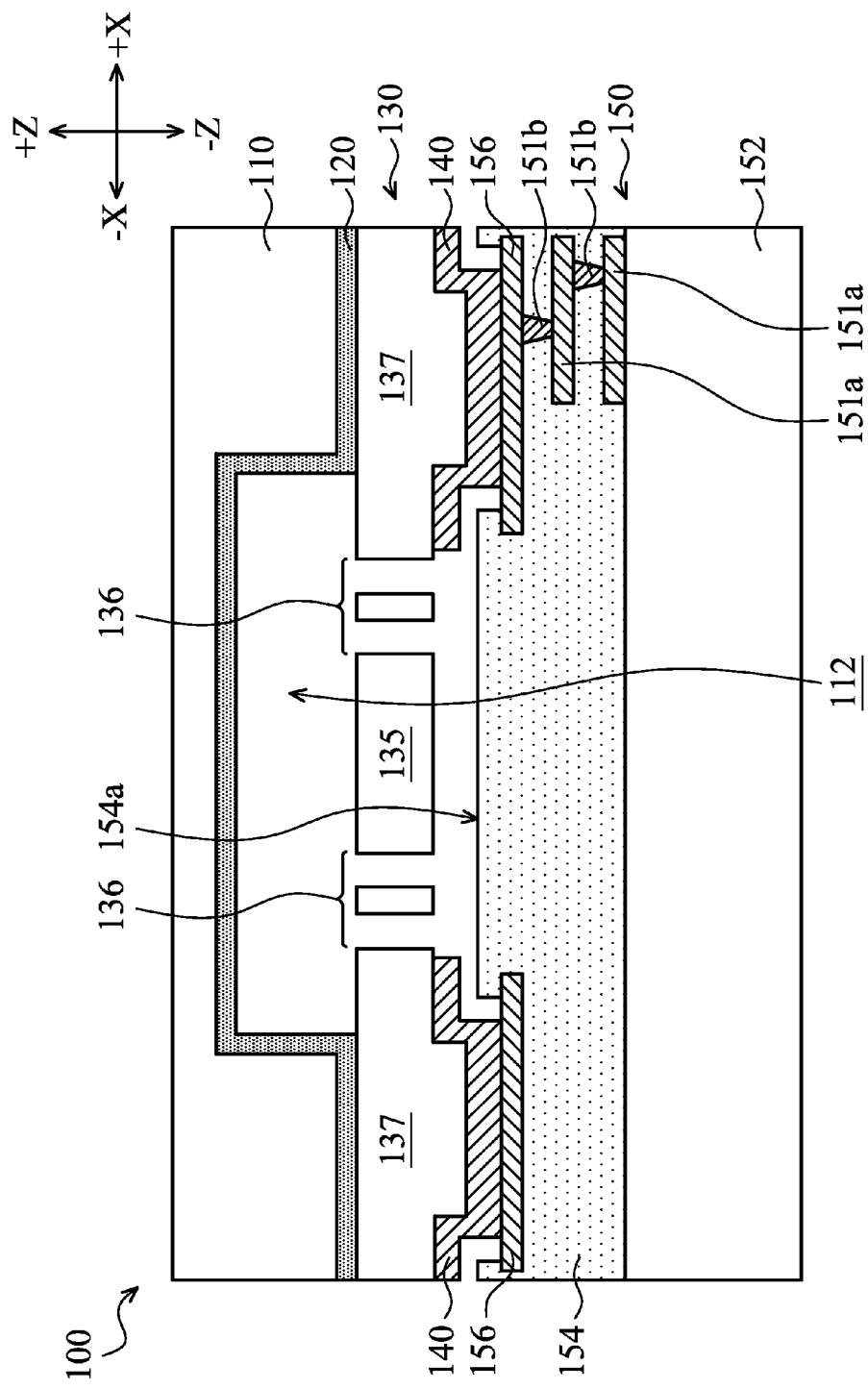

As shown in FIG. 1F, the semiconductor substrate 130 may be flipped over and disposed on a substrate 150. The substrate is a complementary metal-oxide semiconductor (CMOS) substrate or a CMOS wafer, in accordance with some embodiments. The substrate 150 includes a semiconductor substrate 152 and a dielectric layer 154. The dielectric layer 154 includes multiple dielectric layers.

Multiple conductive features (such as lines 151a, vias 151b, and contacts) are formed in the dielectric layer 154. The conductive features include conductive pads 156. Each of the conductive pads 156 is electrically connected to a region or a device element formed in/on the semiconductor substrate 152. In some embodiments, the dielectric layer 154 has a top surface 154a, which is, for example, an oxide surface. The conductive pads 156 (or the top metal) may be buried under the top surface 154a.

Thereafter, a bonding process may be performed to bond the conductive layer 140 to the pads 156 of the substrate 150, and a MEMS device 100 is formed. The bonding process includes a eutectic bonding process or other suitable bonding processes.

In some embodiments, when the movable element 135 moves in the Z directions (+Z direction and −Z direction), the movable element 135 is prone to stick to the substrate 150 due to a stiction force. The stiction issue adversely affects the proper operation of the MEMS device 100. The stiction force includes a capillary force, a molecular van der Waals force and an electrostatic force. In some embodiments, when the movable element 135 moves in the X directions (+X direction and −X direction), the movable element 135 is prone to stick to capacitor plates (not shown) or the springs 136 due to the stiction force.

In some embodiments, for preventing the stiction issue, it is required to reduce the size of the movable element 135 or to increase the stiffness of the springs 136. However, the reduction of the movable element 135 and the increase of the stiffness of the springs 136 may decrease the sensitivity of the MEMS device 100. Therefore, it is desirable to find alternative mechanisms for preventing the stiction issue and maintaining the sensitivity of the MEMS device.

Figure 2A:
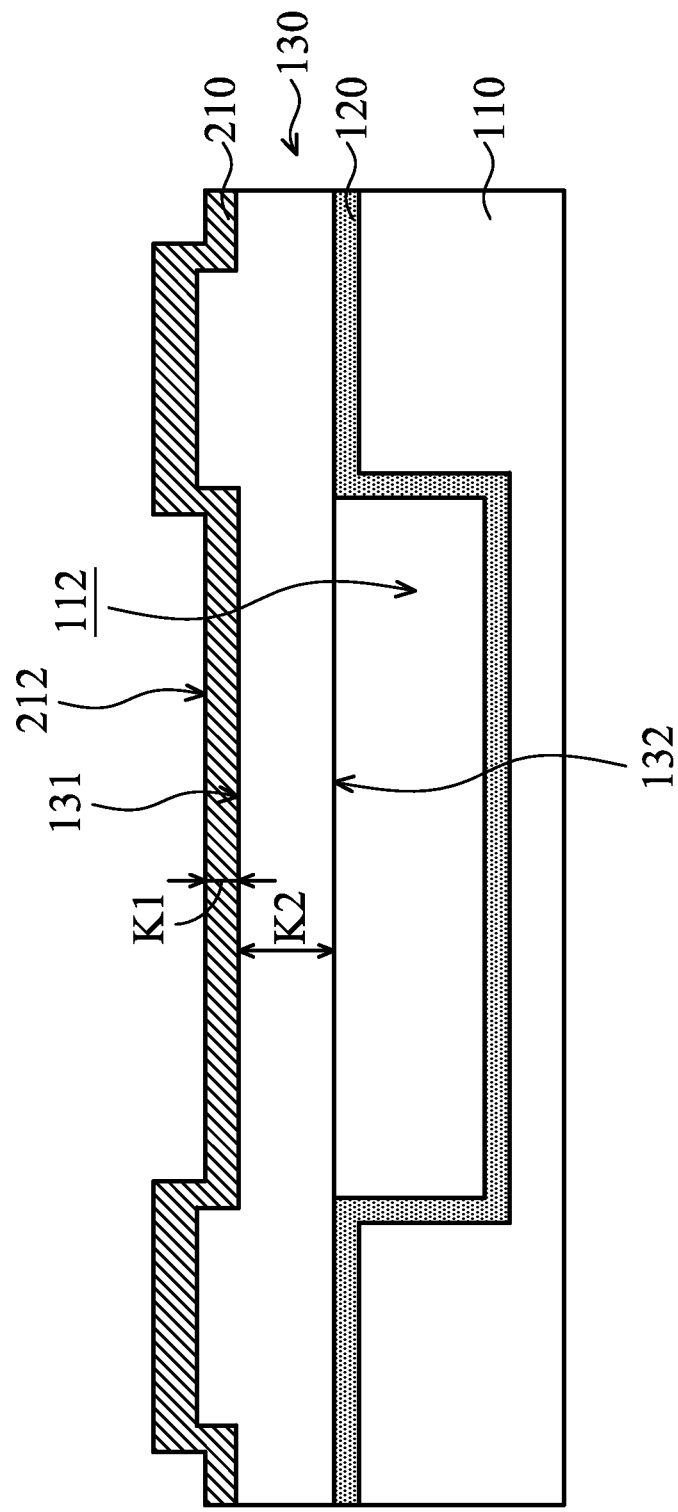
FIGS. 2A-2D are cross-sectional views of various stages of a process for forming a MEMS device, in accordance with some embodiments.

FIGS. 2A-2D are cross-sectional views of various stages of a process for forming a MEMS device, in accordance with some embodiments. As shown in FIG. 2A, after the step of FIG. 1C, a polysilicon layer 210 is deposited on the surface 131 of the semiconductor substrate 130. The polysilicon layer 210 has a rough surface 212. The capillary force and the molecular van der Waals force are positively related to the contact area. The rough surface 212 may reduce the contact area between the polysilicon layer 210 and a substrate subsequently bonded with the semiconductor substrate 130, which may accordingly reduce the stiction force.

The deposition process of the polysilicon layer 210 may include, for example, a thermal decomposition process of a reaction gas including a silane gas. The process temperature of the deposition process may range from about 500° C. to about 700° C.

In some embodiments, the thickness K1 of the polysilicon layer 210 ranges from about 1K Å to about 50K Å. The thickness K1 ranges from, for example, about 5K Å to about 20K Å. In some embodiments, the ratio of the thickness K1 of the polysilicon layer 210 to the thickness K2 of the semiconductor substrate 130 ranges from about 0.1% to about 20%. The surface roughness of the rough surface 212 may be equal to or larger than about 10 nm. In some embodiments, the surface roughness of the rough surface 212 ranges from about 10 nm to about 30 nm.

Figure 2B:
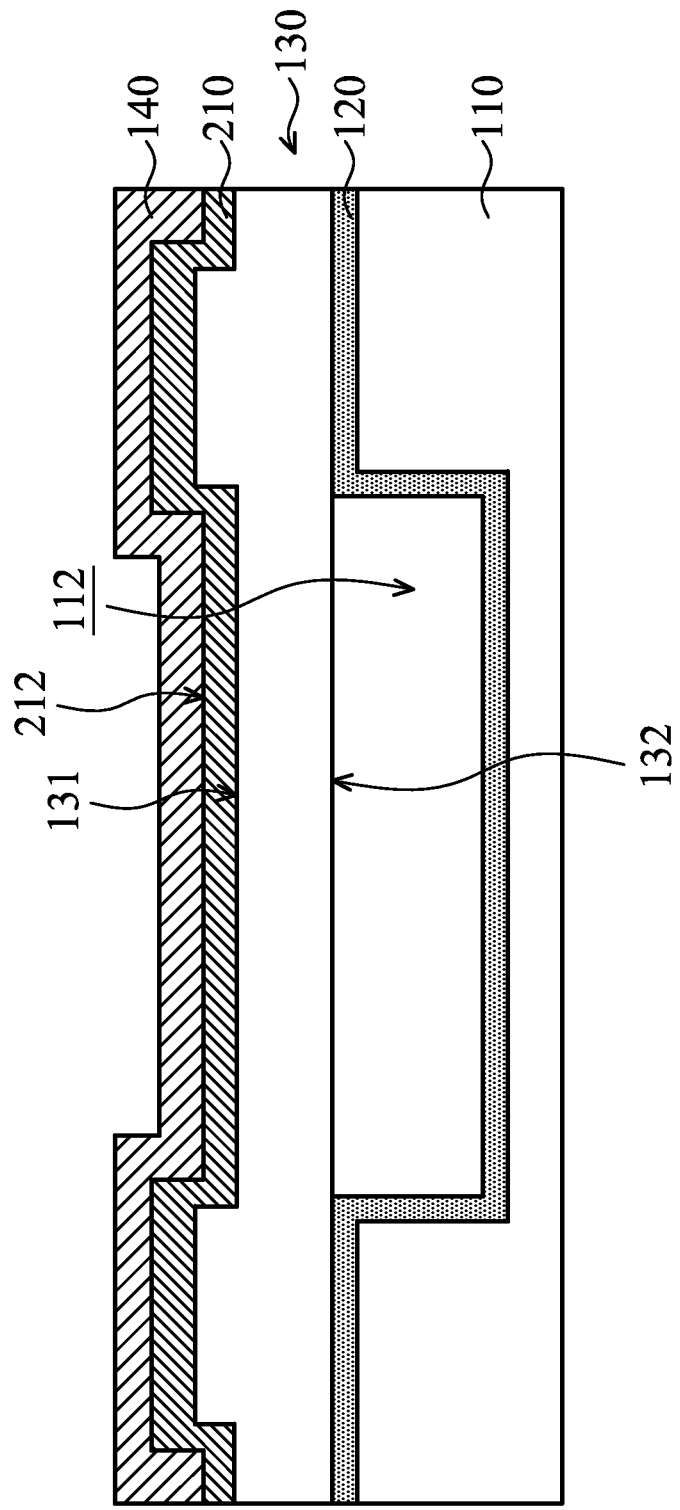
Figure 2C:
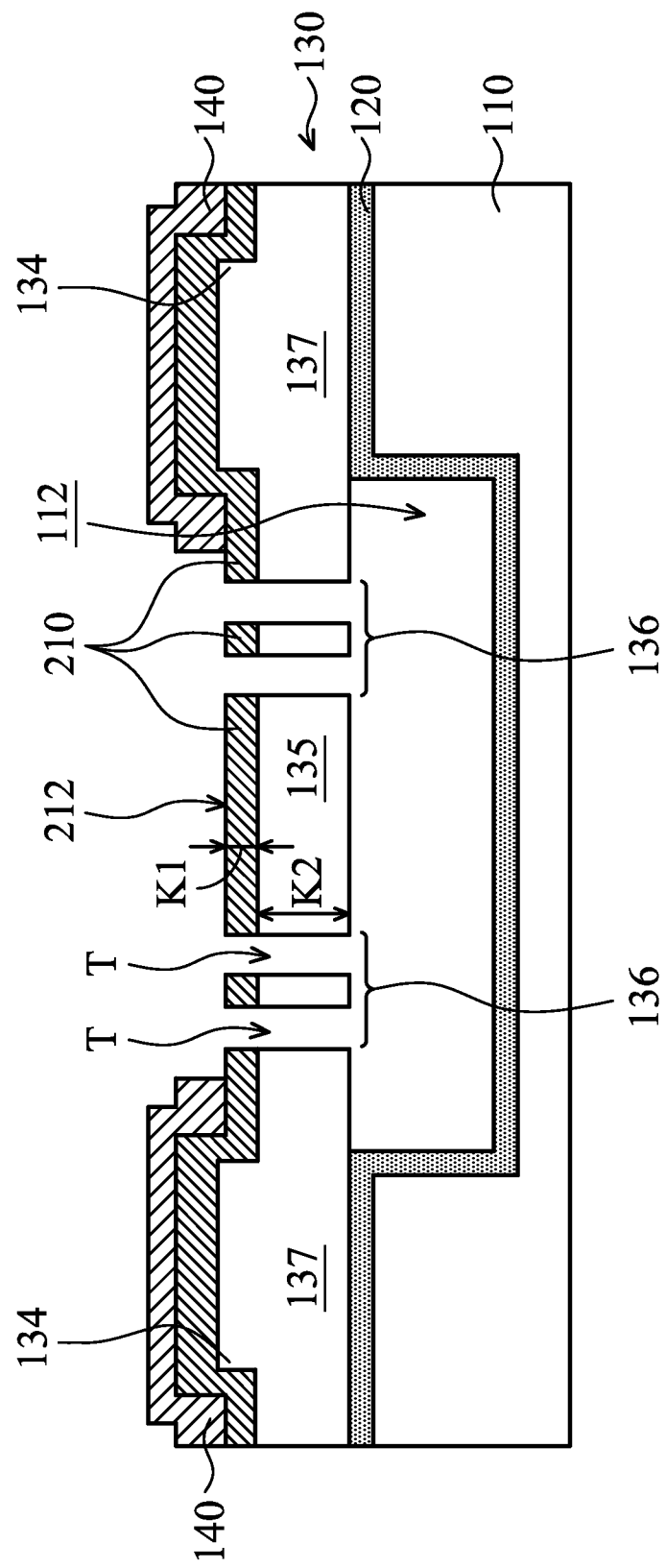

As shown in FIG. 2B, a conductive layer 140 may be deposited on the rough surface 212 of the polysilicon layer 210. Thereafter, as shown in FIG. 2C, the conductive layer 140 is patterned by, for example, a photolithography process and an etching process. The patterned conductive layer 140 covers the stand-off features 134 and exposes a portion of the polysilicon layer 210. The patterned conductive layer 140 may act as a pad layer for electrically connecting the semiconductor substrate 130 with another device in the subsequent process.

Thereafter, the portion of the polysilicon layer 210 exposed by the conductive layer 140 and the semiconductor substrate 130 under the portion of the polysilicon layer 210 are patterned to form trenches T. The trenches T pass through the semiconductor substrate 130 and the polysilicon layer 210. The patterning process includes, for example, a photolithography process and an etching process. The polysilicon layer 210 and the semiconductor substrate 130 may be patterned by the same etching process or by different etching processes.

A movable element (also referred as a proof-mass) 135, springs 136 and a fixed element 137 of the semiconductor substrate 130 are defined by the trenches T. Each of the springs 136 is connected to the movable element 135 and the fixed element 137. The movable element 135 is capable of vibrating, bending, deforming, or the like. In some embodiments, the movable element 135 serves as a sensing element. The semiconductor substrate 130 with the movable element 135, the springs 136 and the fixed element 137 may be referred to as a MEMS substrate or a MEMS structure. In some embodiments, the ratio of the thickness K1 of the polysilicon layer 210 to the thickness K2 of the movable element 135 ranges from about 0.1% to about 20%.

Figure 2D:
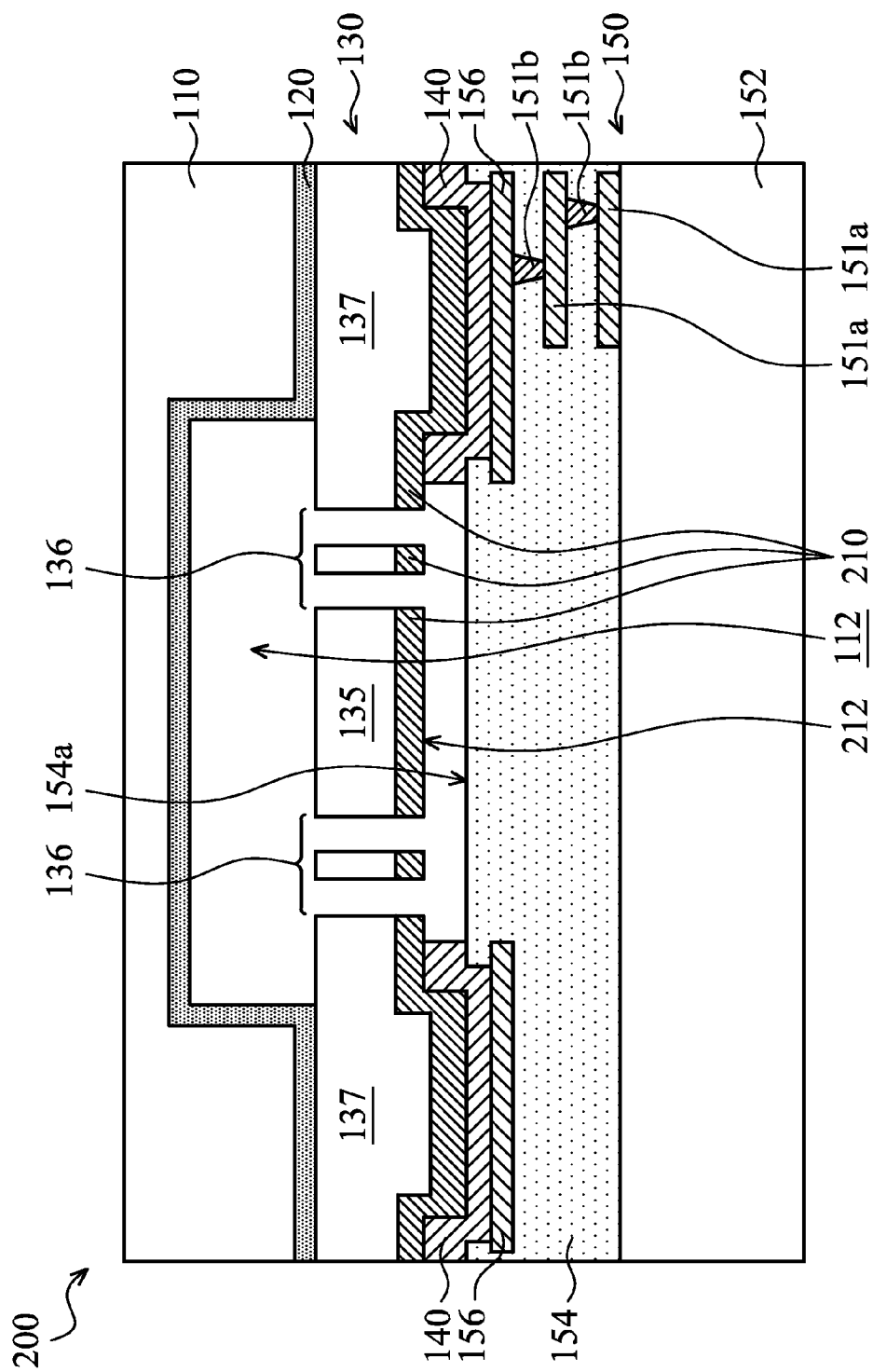

As shown in FIG. 2D, the semiconductor substrate 130 may be flipped over and disposed on a substrate 150. The substrate 150 is a CMOS substrate (or a CMOS wafer), in accordance with some embodiments. The substrate 150 includes a semiconductor substrate 152 and a dielectric layer 154. The dielectric layer 154 includes multiple dielectric layers. Multiple conductive features (such as lines 151a, vias 151b, and contacts) are formed in the dielectric layer 154. The conductive features include conductive pads 156. Each of the conductive pads 156 is electrically connected to a region or a device element formed in/on the semiconductor substrate 152. In some embodiments, the dielectric layer 154 has a top surface 154a, which is, for example, an oxide surface. The conductive pads 156 (or the top metal) may be buried under the top surface 154a.

Thereafter, a bonding process may be performed to bond the conductive layer 140 to the pads 156 of the substrate 150, and a MEMS device 200 is formed. The bonding process includes a eutectic bonding process or other suitable bonding processes.

The polysilicon layer 210 is located between the movable element 135 and the dielectric layer 154 of the substrate 150, and the rough surface 212 of the polysilicon layer 210 may reduce the contact area between the polysilicon layer 210 and the dielectric layer 154. Therefore, the polysilicon layer 210 may prevent the movable element 135 from sticking to the dielectric layer 154, which improve the reliability of the MEMS device 200. Furthermore, since the stiction issue is overcome by using the polysilicon layer 210, the springs 136 of the MEMS device 200 may be designed to be softer than the springs 136 of the MEMS device 100 of FIG. 1F to improve the sensitivity of the MEMS device 200.

Figure 3A:
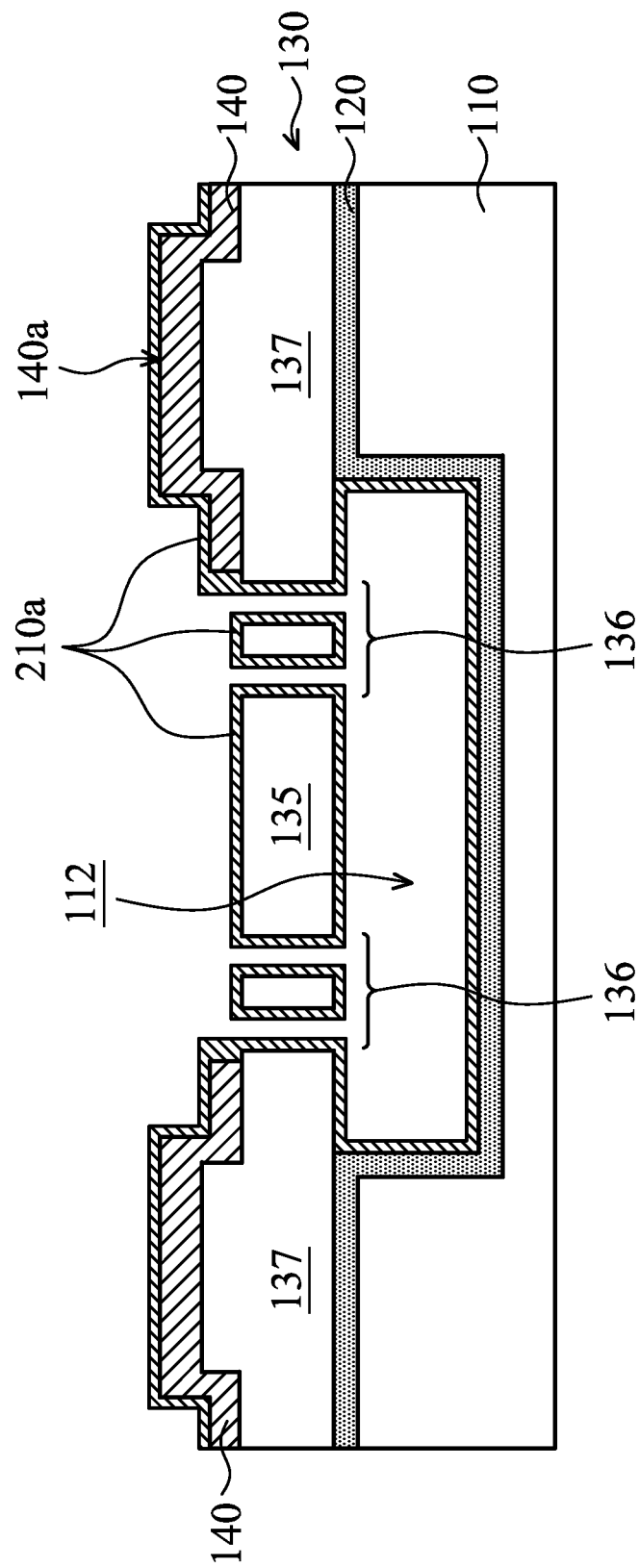
FIGS. 3A-3C are cross-sectional views of various stages of a process for forming a MEMS device, in accordance with some embodiments.
Figure 3B:
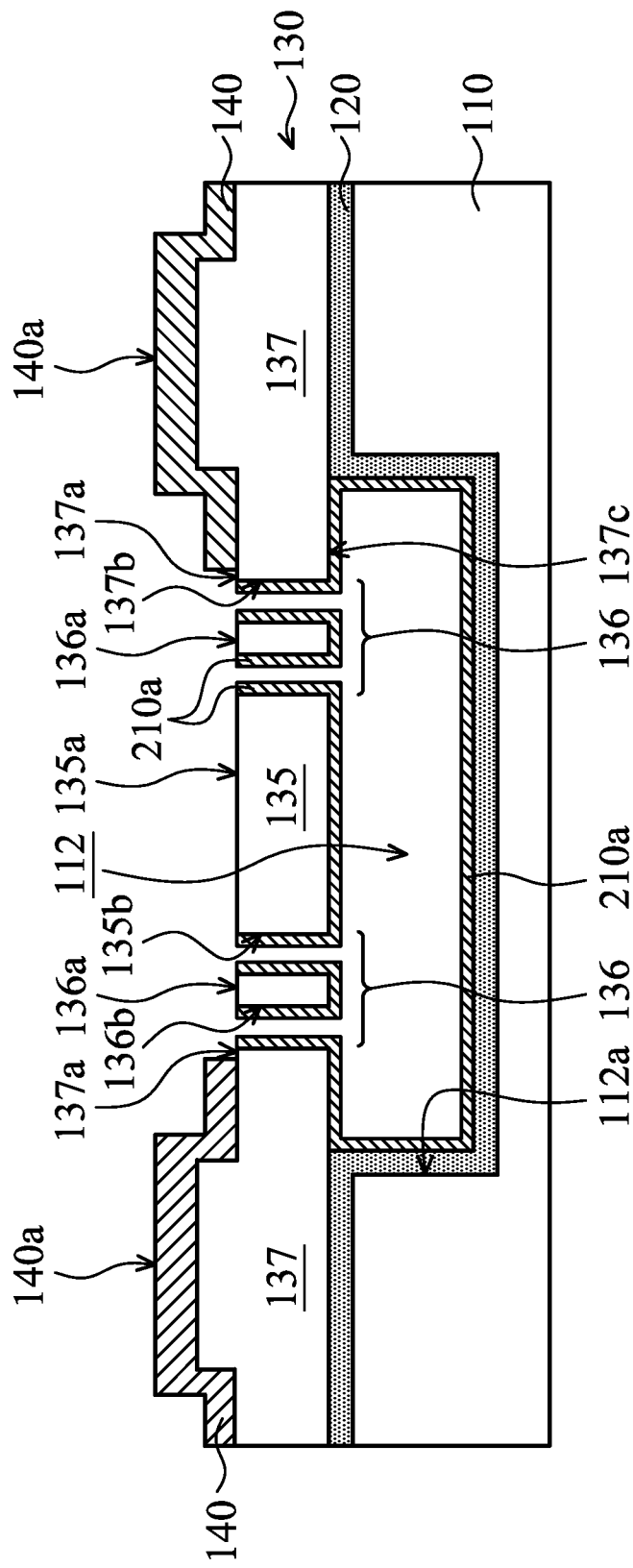
Figure 3C:
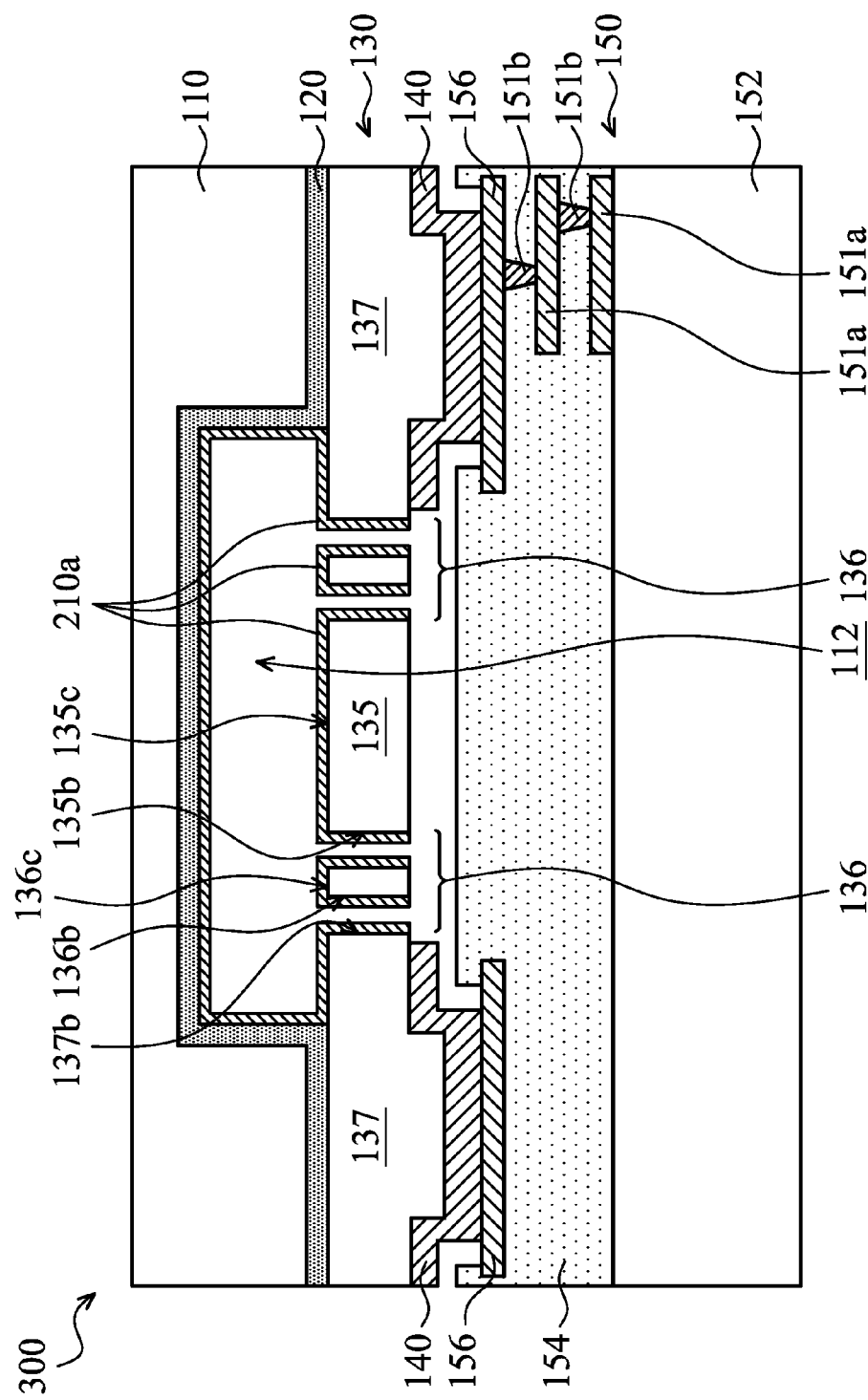

FIGS. 3A-3C are cross-sectional views of various stages of a process for forming a MEMS device, in accordance with some embodiments. As shown in FIG. 3A, after the step of FIG. 1E, a polysilicon layer 210a is deposited on the surfaces of the cap substrate 110, the oxide layer 120, the movable element 135, the springs 136, the fixed element 137 and the conductive layer 140. The deposition process of the polysilicon layer 210a may include, for example, a thermal decomposition process of a reaction gas including a silane gas. The process temperature of the deposition process may range from about 500° C. to about 700° C.

As shown in FIG. 3B, a portion of the polysilicon layer 210a on the surfaces 135a, 136a, 137a and 140a of the movable element 135, the springs 136, the fixed element 137 and the conductive layer 140 may be removed by using an etching process. The surfaces 135a, 136a, 137a and 140a face away from the cap substrate 110. The etching process includes, for example, a reactive ion etching (RIE) process or a deep reactive ion etching (DRIE) process.

After the removal process, the polysilicon layer 210a still covers the sidewalls 135b, 136b and 137b of the movable element 135, the springs 136 and the fixed element 137. Therefore, the polysilicon layer 210a may prevent the movable element 135, the springs 136 and the fixed element 137 from sticking to each other. In some embodiments, the sidewalls 135b, 136b and 137b are adjacent to the surfaces 135a, 136a and 137a of the movable element 135, the springs 136 and the fixed element 137, respectively. In some embodiments, the sidewalls 135b of the movable element 135 face the fixed element 137 or the springs 136.

In some embodiments, a portion of the polysilicon layer 210a continuously covers the fixed element 137 and the inner wall 112a of the cavity 112 of the cap substrate 110. In some embodiments, a portion of the polysilicon layer 210a continuously covers the sidewall 137b and the surface 137c of the fixed element 137, and the surface 137c is opposite to the surface 137a and faces the cap substrate 110.

As shown in FIG. 3C, the semiconductor substrate 130 may be flipped over and disposed on a substrate 150. The substrate 150 is a CMOS substrate (or a CMOS wafer), in accordance with some embodiments. Thereafter, a bonding process may be performed to bond the conductive layer 140 to the pads 156 of the substrate 150, and a MEMS device 300 is formed. The bonding process includes a eutectic bonding process or other suitable bonding processes.

Figure 4:
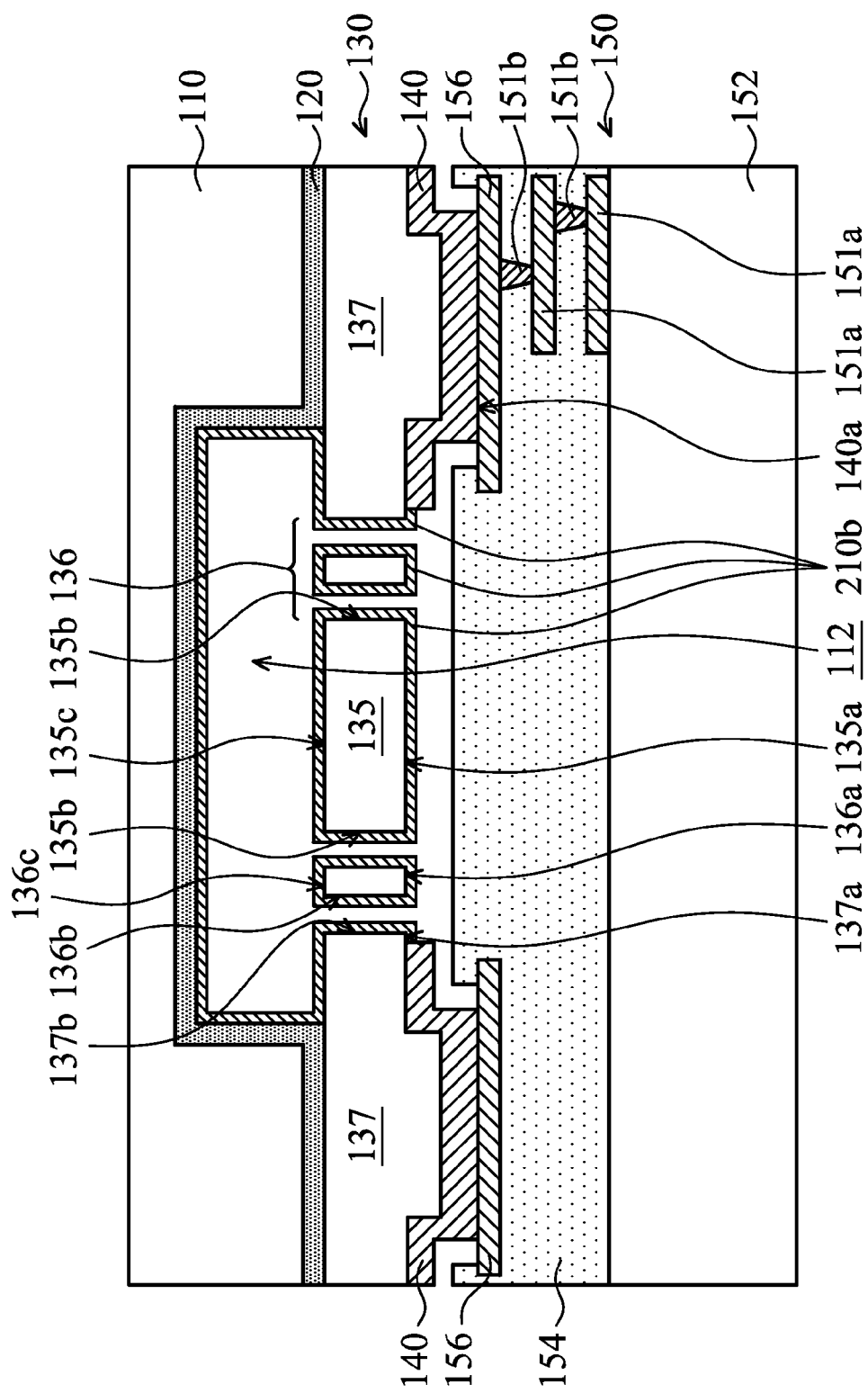
FIG. 4 is a cross-sectional view of a MEMS device, in accordance with some embodiments.

FIG. 4 is a cross-sectional view of a MEMS device, in accordance with some embodiments. As shown in FIG. 4, after the step of FIG. 3A, a portion of the polysilicon layer 210b on the surface 140a of the conductive layer 140 may be removed by using, for example, a photolithography process and an etching process.

After the removal process, the polysilicon layer 210b may still cover the sidewalls 135b, 136b and 137b and the surfaces 135a, 136a and 137a of the movable element 135, the springs 136 and the fixed element 137. Therefore, the polysilicon layer 210b may prevent the movable element 135, the springs 136 and the fixed element 137 from sticking to each other, and may also prevent the movable element 135 from sticking to the substrate 150.

In some embodiments, the polysilicon layer 210b incapsulates the movable element 135 (i.e. the polysilicon layer 210b covers the whole surfaces 135a, 135b and 135c of the movable element 135). In some embodiments, the polysilicon layer 210b covers the whole surfaces 136a, 136b and 136c of the springs 136.

Embodiments of mechanisms for forming a MEMS device described above form a polysilicon layer on the movable element of the MEMS device to prevent the movable element from sticking to other, neighboring elements (or devices).

In accordance with some embodiments, a MEMS device is provided. The MEMS device includes a substrate and a MEMS substrate disposed on the substrate. The MEMS substrate includes a movable element, a fixed element and at least a spring connected to the movable element and the fixed element. The MEMS device also includes a polysilicon layer on the movable element.

In accordance with some embodiments, a MEMS device is provided. The MEMS device includes a MEMS substrate including a movable element, a fixed element and at least a spring connected to the movable element and the fixed element. The MEMS device also includes a polysilicon layer on the movable element.

In accordance with some embodiments, a method for forming a micro-electro mechanical system (MEMS) device is provided. The method includes providing a semiconductor substrate. The method also includes forming a polysilicon layer on the semiconductor substrate. The method further includes performing a patterning process to the semiconductor substrate to form a plurality of trenches passing through the semiconductor substrate. The trenches define a movable element, at least a spring and a fixed element of the semiconductor substrate, the spring is connected to the movable element and the fixed element. The polysilicon layer is at least on the movable element.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A micro-electro mechanical system (MEMS) device, comprising:
   a substrate;
   a MEMS substrate disposed on the substrate, wherein the MEMS substrate comprises a movable element, a fixed element and at least a spring connected to the movable element and the fixed element; and
   a polysilicon layer formed on the movable element, wherein the polysilicon layer covers a portion of the movable element and is between the movable element and a fixed surface so as to prevent the movable element from being adhered to the fixed surface.

2. The MEMS device as claimed in claim 1, wherein the movable element has a surface facing the substrate, and the polysilicon layer is on the surface.

3. The MEMS device as claimed in claim 1, wherein the movable element has a sidewall facing the spring or the fixed element, and the polysilicon layer is on the sidewall.

4. The MEMS device as claimed in claim 3, wherein the movable element has a surface facing the substrate, and the polysilicon layer is further on the surface.

5. The MEMS device as claimed in claim 1, wherein the movable element has a first sidewall facing the spring, the spring has a second sidewall facing the movable element, and the polysilicon layer is on the first sidewall and the second sidewall.

6. The MEMS device as claimed in claim 1, wherein the polysilicon layer is further on the fixed element.

7. The MEMS device as claimed in claim 1, further comprising:
   a cap substrate on the MEMS substrate, wherein the cap substrate has a cavity right above the movable element and the spring.

8. The MEMS device as claimed in claim 7, wherein the polysilicon layer is further on an inner wall of the cavity of the cap substrate.

9. The MEMS device as claimed in claim 8, wherein a portion of the polysilicon layer continuously covers the fixed element and the inner wall of the cavity of the cap substrate.

10. The MEMS device as claimed in claim 1, wherein a ratio of a thickness of the polysilicon layer to a thickness of the movable element ranges from about 0.1% to about 20%.

11. A micro-electro mechanical system (MEMS) device, comprising:
    a MEMS substrate comprising a movable element, a fixed element and at least a spring connected to the movable element and the fixed element; and
    a polysilicon layer formed on the movable element, wherein the polysilicon layer covers a portion of the movable element and is between the movable element and a fixed surface so as to prevent the movable element from being adhered to the fixed surface.

12. The MEMS device as claimed in claim 11, further comprising:
    a pad layer on the fixed element of the MEMS substrate, wherein the pad layer and the polysilicon layer are on the same surface of the MEMS substrate.

13. The MEMS device as claimed in claim 12, wherein the polysilicon layer is further on the fixed element, and the pad layer is on the polysilicon layer.

14. The MEMS device as claimed in claim 12, further comprising:
    a complementary metal-oxide semiconductor (CMOS) substrate, wherein the MEMS substrate is on the CMOS substrate and is electrically connected to the CMOS substrate via the pad layer.

15. A method for forming a micro-electro mechanical system (MEMS) device, comprising:
    providing a semiconductor substrate;
    forming a polysilicon layer on the semiconductor substrate; and
    performing a patterning process to the semiconductor substrate to form a plurality of trenches passing through the semiconductor substrate, wherein the trenches define a movable element, at least a spring and a fixed element of the semiconductor substrate, the spring is connected to the movable element and the fixed element, and the polysilicon layer is on the movable element.

16. The method for forming a MEMS device as claimed in claim 15, further comprising:
    after the patterning process, bonding the semiconductor substrate to a substrate, wherein the polysilicon layer is on a surface of the movable element facing the substrate.

17. The method for forming a MEMS device as claimed in claim 15, wherein the polysilicon layer is formed before the patterning process, and the patterning process is also performed to the polysilicon layer so as to form the trenches simultaneously passing through the semiconductor substrate and the polysilicon layer.

18. The method for forming a MEMS device as claimed in claim 15, wherein the polysilicon layer is formed after the patterning process.

19. The method for forming a MEMS device as claimed in claim 18, wherein the polysilicon layer is formed on a sidewall of the movable element facing the spring.

20. The method for forming a MEMS device as claimed in claim 19, wherein the polysilicon layer is further formed on a surface of the movable element adjacent to the sidewall of the movable element.

* * * * *